(12) United States Patent
Soloviev et al.

(10) Patent No.: US 8,198,650 B2
(45) Date of Patent: Jun. 12, 2012

(54) SEMICONDUCTOR DEVICES AND SYSTEMS (75) Inventors: Stanislav Ivanovich Soloviev, Albany, NY (US); Ho-Young Cha, Seoul (KR); Peter Micah Sandvik, Niskayuna, NY (US); Alexey Vert, Schenectady, NY (US); Jody Alan Fronheiser, Selkirk, NY (US)

(73) Assignee: General Electric Company, Niskayuna, NY (US)

( * ) Notice: Subject to any disclaimer, the term of this patent is extended or adjusted under 35 U.S.C. 154(b) by 234 days.

(21) Appl. No.: 12/329,841

(22) Filed: Dec. 8, 2008

(65) Prior Publication Data

US 2010/0140730 A1 Jun. 10, 2010

(51) Int. Cl.
*H01L 29/66* (2006.01)
(52) U.S. Cl. ........ 257/104; 257/291; 257/292; 257/438; 257/E31.063
(58) Field of Classification Search .................. 257/104, 257/438, 291, 292, E31.063
See application file for complete search history.

(56) References Cited

U.S. PATENT DOCUMENTS

| | | | | |
|---|---|---|---|---|
| 3,890,630 | A | * | 6/1975 | Huang ........................... 257/604 |
| 4,799,100 | A | | 1/1989 | Blanchard et al. |
| 5,001,335 | A | | 3/1991 | Takaoka et al. |
| 5,157,473 | A | | 10/1992 | Okazaki |
| 5,181,084 | A | * | 1/1993 | Bommer et al. ................. 257/94 |
| 5,434,442 | A | | 7/1995 | Lesk et al. |
| 5,866,936 | A | | 2/1999 | Hasnian et al. |
| 2009/0242923 | A1 | * | 10/2009 | Goodrich ......................... 257/99 |

FOREIGN PATENT DOCUMENTS

| | | |
|---|---|---|
| EP | 205899 A1 | 12/1986 |
| GB | 2207803 A | 2/1989 |
| WO | WO2006074990 A1 | 7/2006 |

* cited by examiner

*Primary Examiner* — Tan N Tran
(74) *Attorney, Agent, or Firm* — Ann M. Agosti (57) ABSTRACT

A semiconductor device is disclosed. The semiconductor device comprises, a first region of a first conductivity type, a second region of a second conductivity type disposed adjacent to the first region to form a p-n junction structure, a resistance modification region of the second conductivity type, and a field response modification region of the second conductivity type disposed between the resistance modification region and the second region, wherein the field response modification region comprises a varying dopant concentration distribution along a thickness direction of the field response modification region.

25 Claims, 4 Drawing Sheets

SEMICONDUCTOR DEVICES AND SYSTEMS

STATEMENT REGARDING FEDERALLY SPONSORED RESEARCH & DEVELOPMENT

The invention relates generally to semiconductor devices. More specifically, the invention relates to semiconductor devices including positively (p) and negatively (n) doped "p-n" junction structures.

BACKGROUND

The invention relates generally to semiconductor devices. More specifically, the invention relates to semiconductor devices including a positively (p) and negatively doped (n) "p-n" junction structures.

Semiconductor devices that include a p-n junction, in order to achieve acceptable levels of performance in operational characteristics such as signal-to-noise ratio and gain, require the application of a uniform and high voltage along the p-n structure. Further, these devices are often required to operate in the breakdown mode, wherein the transfer characteristics become strongly non-linear.

Such devices enter their breakdown mode typically upon application of a voltage having a value that is at or above a certain value referred to as the "breakdown voltage." The value of the breakdown voltage depends on several factors, including but not limited to the material characteristics of the device.

Currently available p-n junction structure semiconductor devices contain multiple regions containing interfaces between the different regions. The application of a high electric field during an operation of such a semiconductor device can result in the development of electric field profiles within the device, such that the electric field at locations along the different interfaces between the regions, such as at locations in a vicinity of an edge, are independently different from the bulk of the device.

Under such a scenario, the reliability and consequently the usefulness of the semiconductor device is compromised, as it is highly desirable that the breakdown mode operation of the semiconductor device is initiated or controlled via the bulk of the semiconductor device.

A technique whereby the above limitations of existing semiconductor devices can be mitigated would therefore be highly desirable.

BRIEF DESCRIPTION

Briefly, embodiments of the present invention are directed towards p-n device structures and systems including such structures.

In accordance with one embodiment of the present invention, a semiconductor device comprises: a first region of a first conductivity type, a second region of a second conductivity type disposed adjacent to the first region to form a p-n junction structure, a resistance modification region of the second conductivity type, and a field response modification region of the second conductivity type disposed so as to be between and in contact with the resistance modification region and the second region, wherein the field response modification region comprises a varying dopant concentration distribution region along a thickness direction of the field response modification region.

In accordance with another embodiment of the present invention an electronic system comprises: a semiconductor device, and an arrangement for reverse biasing the semiconductor device; wherein, the semiconductor device comprises: a first region of a first conductivity type, a second region of a second conductivity type disposed adjacent to the first region to form a p-n junction structure, a resistance modification region of the second conductivity type, and a field response modification region of the second conductivity type disposed between the resistance modification region and the second region, wherein the field response modification region comprises a varying dopant concentration distribution along a thickness direction of the field response modification region.

In accordance with another embodiment of the present invention, a semiconductor device comprises: a first region of a first conductivity type, a second region of a second conductivity type disposed adjacent to the first region to form a p-n junction structure, a resistance modification region of the second conductivity type, and an implanted resistive region disposed so as to be in contact with the resistance modification region and the second region, wherein an electrical resistance of the implanted resistive region is substantially greater than a resistance of the resistance modification region and substantially greater than a resistance of the second region.

These and other advantages and features will be more readily understood from the following detailed description of preferred embodiments of the invention that is provided in connection with the accompanying drawings.

DETAILED DESCRIPTION

In the following description, whenever a particular aspect or feature of an embodiment of the invention is said to comprise or consist of at least one element of a group or combinations thereof, it is understood that the aspect or feature may comprise or consist of any of the elements of the group, either individually or in combination with any of the other elements of that group.

In the following specification and the claims that follow, the singular forms "a," "an," and "the" include plural referents unless the context clearly dictates otherwise.

Approximating language, as used herein throughout the specification and claims, may be applied to modify any quantitative representation that could permissibly vary without resulting in a change in the basic function to which it is related. Accordingly, a value modified by a term or terms, such as "about" or "substantially," may be not to be limited to the precise value specified, and may include values that differ from the specified value. In at least some instances, the approximating language may correspond to the precision of an instrument for measuring the value.

As used herein, the term "within," when used in context of discussion of any physical entity may refer to a bulk of the physical entity or it may refer to a surface of the physical entity, or it may refer to both the bulk and the surface of the physical entity.

Figure 1:
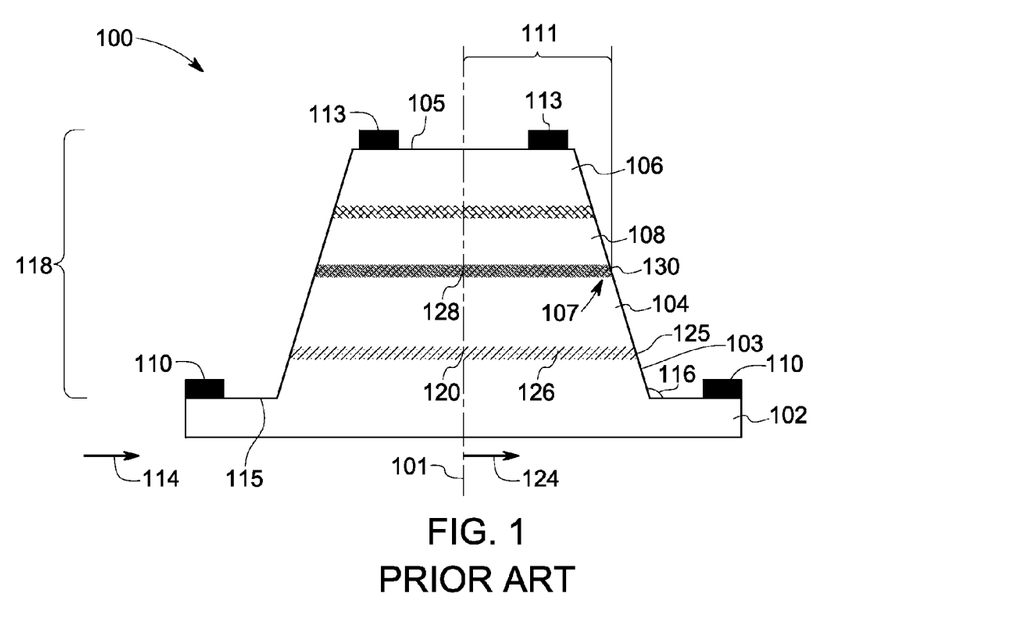
FIG. 1 is a cross-sectional view of a prior art semiconductor device.

Without loss of generality, the discussions herein will be based on semiconductor devices having a p-n structure, such as of the type presented in FIG. 1. One skilled in the art may recognize generic features of the discussions presented herein that remain substantially valid for semiconductor devices having other structures, such as for instance, p-i-n structures, wherein "i" means intrinsic. Such semiconductor devices containing p-i-n structures also fall within the scope of the present invention.

As used herein, the term "region" refers to a physical volume or surface whose extent in space is substantially finite, and the variation of one or more physical characteristics, such as dopant concentration, within which, is substantially well defined. One skilled in the art of semiconductor devices would appreciate that, an interface between any two or more regions within the semiconductor device may itself be considered as a "region". One skilled in the art of semiconductor devices would also appreciate that one or more regions, for instance, having differing physical characteristics such as dopant species and/or dopant concentration and/or electrical resistance, may together be considered, for instance, from a functional perspective, as a single region having a common function. Furthermore, one skilled in the art of semiconductor devices would also appreciate that, a semiconductor device having different regions may be fabricated out of a monolithic piece of semiconductor material that initially constituted, as per the definition above, a single region. One skilled in the art of semiconductor devices would also appreciate that a semiconductor device having different regions may be fabricated via successive or simultaneous deposition of different "layers" or "films," such as for instance via any of the well known film deposition techniques.

As used herein, the term "beveled profile," when used in the context of discussion of any physical quantity, such as dopant concentration, across two or more regions of a semiconductor device indicates that the said physical quantity has a different value in each of the said two or more regions, i.e., the rate of change of the said physical quantity across the said two or more regions is non-zero. Furthermore, the terms "negative" or "positive" when used to qualify any beveled profile indicate respectively whether rate of change of the corresponding physical quantity is positive or negative.

As used herein, the term "adjacent," when used in context of discussion of different regions and/or parts comprising a semiconductor device may refer to the situation where the regions and/or parts under discussion are immediately next to each other, or it may also refer to a situation wherein intervening regions and/or parts are present between the regions and/or parts under discussion.

In the present discussions it is to be understood that, unless explicitly stated otherwise, any range of numbers stated during a discussion of any region within, or physical characteristic of, a semiconductor device, is inclusive of stated end points of the range.

With specific reference to FIG. 1, there is shown, in side cross-sectional view, an example of a prior art semiconductor device having a solid frustum like structure. FIG. 1 shows a semiconductor device 100 that includes a first region 102, a second region 104, a resistance modification region 106, and a field response modification region 108. The semiconductor device 100 further includes at least one first electrical contact pad 110, and at least one second electrical contact pad 113, that can be used to form electrical connections between different regions within the semiconductor device 100, or they can be used to form electrical connections between the semiconductor device and any suitable external device. The dopant concentrations within the first region 102, the second region 104, the resistance modification region 106, the field response modification region 108, the at least one first electrical contact pad 110, and the at least one second electrical contact pad 113 are substantially uniform and fixed independently based on the specific operational requirements of the semiconductor device 100. If the conductivity type of the first region 102 is p-type, and that of the second region is n-type, then those skilled in the art would recognize the resulting semiconductor device as having a p-n structure.

The illustrated embodiment of the semiconductor device 100, as shown in FIG. 1, includes an edge 103 that is inclined, with respect to a "horizontal" direction 114, at an angle 116. In one embodiment, the angle 116 is substantially obtuse, so that the portion 118 is shaped like a frustum. Without loss of generality, such embodiments of semiconductor device 100 will be referred to as "frustum like embodiments". In alternate embodiments of the semiconductor device 100, the angle 116 can be substantially orthogonal, so that the portion 118 is shaped like a cylinder. Without loss of generality, such embodiments of semiconductor device 100 will be referred to as "orthogonal embodiments". Conventional fabrication techniques are less expensive when angle 116 is substantially obtuse as compared with being substantially orthogonal. On the other hand, embodiments of the semiconductor device 100 in which the angle 116 is substantially orthogonal (orthogonal embodiments) possess "breakdown mode" operational characteristics that are, in certain situations, more desirable as compared to the breakdown mode operation characteristics of embodiments of the semiconductor device 100 in which the angle 116 is substantially obtuse (frustum like embodiments). Typically, while fabricating semiconductor devices of type 100, one tries to achieve a balance between cost of fabrication and operational characteristics of the fabricated device. Any improvement in design of, for example, the illustrated semiconductor device 100 that would enable the resulting semiconductor device to display, during operation, breakdown mode operating characteristics comparable to those displayed by a semiconductor device of type 100 in which the angle 116 is substantially orthogonal, would therefore be highly desirable.

Information about an operational performance of the prior art semiconductor device 100 is obtained from a simulated study of voltage versus current (V-I) characteristics of the semiconductor device 100. For the purposes of such a study, computations of V-I characteristics of two "simulated" embodiments of the prior art semiconductor device 100 were performed. The simulated voltage (V) was applied as a reverse bias between the at least one electrical contact pad 110 and the at least one second electrical contact pad 113. The simulated current (I) was measured across the same set of contact pads. In both simulated embodiments, the first region 102 has a thickness of about 2 micrometers and a dopant concentration of about $3 \times 10^{18}/cm^3$, the second region 104 has a thickness of about 2.7 micrometers and a dopant concentration of about $1 \times 10^{16}/cm^3$, the resistance modification region 106 has a thickness of about 0.1 micrometers and a dopant concentration of about $2 \times 10^{19}/cm^3$, and a field response modification region 108 has a thickness of about 0.2 micrometers and a dopant concentration of about $2 \times 10^{18}/cm^3$. As is typical for prior art semiconductor devices of type 100, the aforementioned dopant concentrations within each of the aforementioned regions are approximately uniform. The simulated embodiments differed in that, in the first simulated embodiment, the angle 116 is substantially obtuse, and has a value of about 110 degrees, while in the second simulated embodiment, the angle 116 is substantially orthogonal, and has a value of about 90 degrees. It is also noted that in typical prior art semiconductor devices of type 100, the value of dopant concentration within the field response modification region 108 is approximately uniform, i.e., the dopant concentration is substantially constant along all directions.

Figure 2:
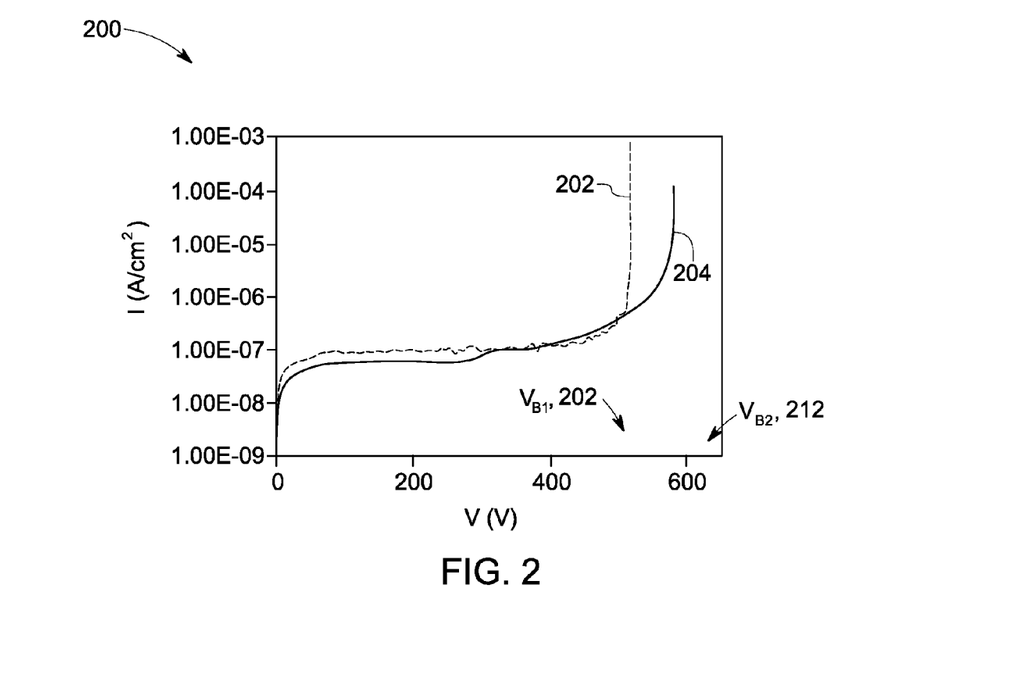
FIG. 2 is a simulated plot of voltage versus current characteristics of embodiments of the prior art semiconductor device of FIG. 1.

FIG. 2 illustrates the simulated V-I characteristics 200 of the above mentioned two embodiments of the semiconductor device 100. Computed V-I characteristic 202 belongs to an embodiment of the semiconductor device 100 in which the angle 116 is obtuse and approximately about 110 degrees, and computed V-I characteristic 204 belongs to an embodiment of the semiconductor device 100 in which the angle 116 is substantially orthogonal. From a perusal of V-I characteristic 202, it is evident that the embodiment to which it corresponds displays breakdown mode operation above a voltage $V_{B1}$ of approximately 520 Volts. This voltage is indicated in FIG. 2 via reference numeral 210. From a similar perusal of V-I characteristic 204, it is evident that the embodiment to which it corresponds displays breakdown mode operation above a voltage $V_{B2}$ of approximately 580 Volts. This voltage is indicated in FIG. 2 via reference numeral 212. Furthermore, it is also evident that $V_{B1} < V_{B2}$, i.e., a semiconductor device having an angle 116 that is substantially obtuse displays a breakdown voltage that is lower than the breakdown voltage of a semiconductor device having an angle 116 that is substantially orthogonal. In other words, other factors being substantially constant, the frustum-like embodiment of semiconductor device 100 displays a premature breakdown as compared to the orthogonal embodiment of the semiconductor device 100.

Figure 3:
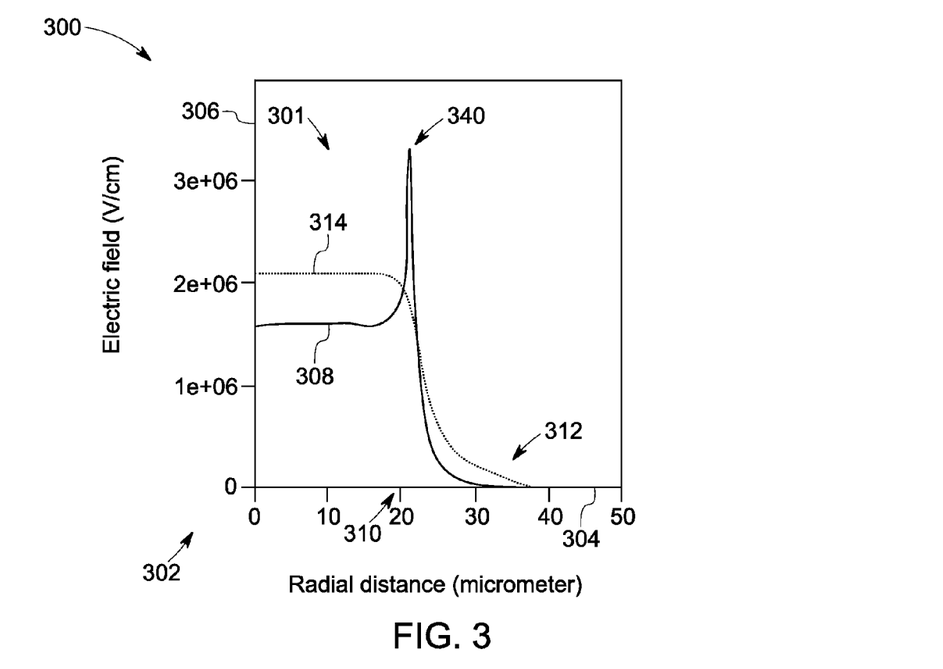
FIG. 3 is a simulated graphical representation of a variation of electric field as a function of radial distance within an embodiment of the semiconductor device of FIG. 1.

FIG. 3 illustrates the results, of calculated variation of electric field within the semiconductor device 100, along lines beginning at different locations on the axis 101, and extending outward in a given radial direction 124 to the edge 103. FIG. 3 is a graph 300 that shows two data sets 301, plotted together on a rectangular coordinate system 302 for comparison. The abscissa 304 of the rectangular coordinate system 302 represents a radial distance along a radial direction 124, while the corresponding value of electric field is plotted along the ordinate 306 of the rectangular coordinate system 302. A length scale of significance in the present discussions is the radial separation between the axis 101 and the region 107 that is in a vicinity of both an interface region 109 between the second region 104 and the field response modification region 108, and the edge 103. This length scale is referred to herein as the first length scale 111 and is indicated as location 310 on the abscissa 304. Another length scale of significance in the present discussions is the radial distance between the axis 101 and the edge 103. This length scale is referred to herein as the second length scale. It may be clear that the value of the second length scale is a function of location along axis 101. For instance, in the presently illustrated prior art device 100, the value of the second length scale increases substantially linearly as one goes from the "top" edge 105 of the semiconductor device 300, towards the "bottom" 115 edge of the semiconductor device 100.

The data sets 301 plotted in FIG. 3 were computed for typical operating conditions near a breakdown at approximately about 510 Volts, and as such the data sets 301 may be considered representative of the considerations involved in the discussions herein.

Plot 308 in FIG. 3 shows a variation of electric field as a function of distance along a radial line beginning from a point 128 (FIG. 1) on the axis 101 and extending outward in a radial direction, say 124, till a point 130 on the edge 103 of the semiconductor device 100. The point 128 is substantially in a vicinity of an interface region 109 between the second region 104 and the field response modification region 108. Similarly to the case of plot 108, plot 114 in FIG. 3 shows a computed variation of an electric field as a function of distance along a radial line beginning from a point 120 on the axis 101 and extending outward in a radial direction, say 124, till a point 125 on the edge 103 of the semiconductor device 100. The point 120 lies within an interface region 126 between the first region 102 and the second region 104. The radial distance 123 between the points 120 and 125 within the semiconductor device 100 corresponds to the second length scale for this case, and is indicated as the location 312 on the abscissa 304.

It may be evident from FIG. 3, that the radial distance dependence of the electric field for the two data sets 308 and 314 is substantially similar up to approximately the first length scale indicated as location 310. For radial distances beyond location 310 and up to approximately the location 312 corresponding to the second length scale, the radial distance dependence of the electric field for the two data sets 308 and 314 show markedly different trends: for instance, data set 308 shows a distinct peak 340 in the vicinity of the first length scale. This is in sharp contrast to the behavior of the data set 314, which shows only a gradual change of slope in the vicinity of the first length scale.

As noted above, there is a distinct departure in type of variation of the electric field, plotted along the ordinate 306, with respect to radial distance, plotted along the abscissa 304, within and in the vicinity of a region 316 contained between radial distances that lie between the first length scale 111 and the present second length scale 123. As noted earlier the first length scale 111 and the present second length scale 123 correspond respectively to the points 310 and 312 on the abscissa 304. The distinct spike in the data set 308 within and in a vicinity of the region 316 is one of the probable causes of premature electrical breakdown of the frustum-like embodiment of the semiconductor device 300, as compared with the orthogonal embodiment of the semiconductor device 300. Thus, during operation of the semiconductor device 100, it is clear from data set 314 that electric field at locations in the vicinity of an interface, for instance, along an edge-end of an interface of the device, can have a value that is substantially different and possibly exceeding the breakdown electric field value, even as the value of the electric field within the bulk remains below the breakdown field value. In such a situation, an electrical breakdown along the edge can occur, i.e., the location along the edge will likely operate in a breakdown mode, even as the bulk experiences no such electrical breakdown. Once electrical breakdown is initiated in the above manner along the edge, it is likely to not only introduce noise in the device operational characteristics, but also potentially hasten the bulk breakdown of the prior art semiconductor device 100.

Without being limited by any particular theory, it is possible that the sharp increase in electric field at locations within the semiconductor device 100, as evidenced by peak 340, is one of the causative factors that results in the earlier observation wherein $V_{B1} < V_{B2}$. A design modification of device 100 which would allow for a frustum-like embodiment to display V-I characteristics that substantially match to the V-I characteristics of an orthogonal embodiment, and for which, $V_{B1}$ and $V_{B2}$ are substantially similar, would therefore be highly desirable.

Embodiments of the present invention include semiconductor devices including a field response modification region, which includes a varying dopant concentration distribution along a thickness direction of the field response modification region.

Figure 4:
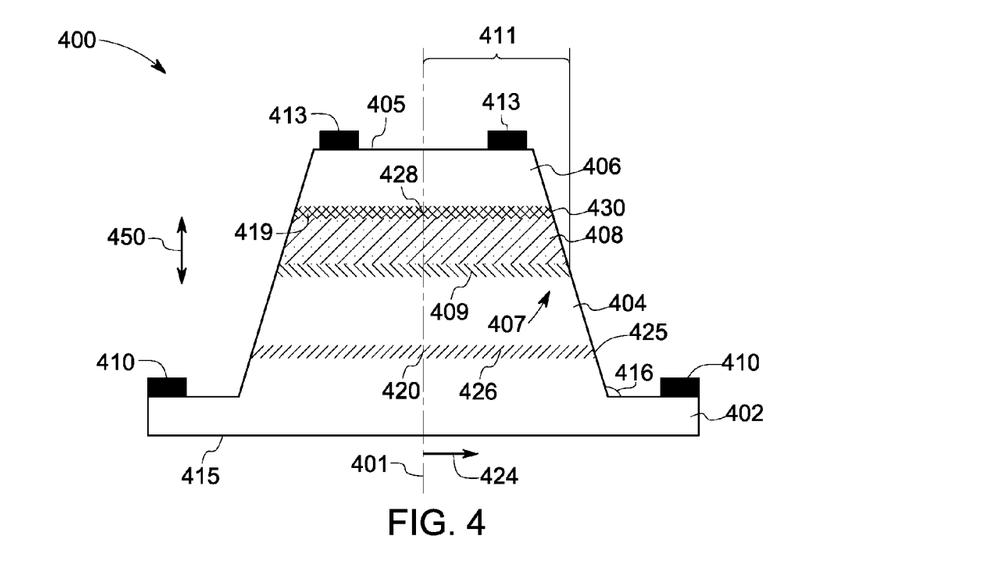
FIG. 4 is a cross-sectional view of a semiconductor device in accordance with an embodiment of the invention.

In accordance with one embodiment of the invention therefore, a semiconductor device 400 is shown in FIG. 4. The semiconductor device 400 includes a first region 402 of a first conductivity type, a second region 404 of a second conductivity type disposed adjacent to the first region 402 to form a p-n junction structure, a resistance modification region 406 of the second conductivity type disposed adjacent to the second region 404 and on an opposite side of the first region 402, and a field response modification region 408 of the second conductivity type disposed so as to be in contact with the resistance modification region 406 and the second region 404, wherein the field response modification region 408 includes a varying dopant concentration distribution region along a thickness direction 450 of the field response modification region 408.

Figure 7:
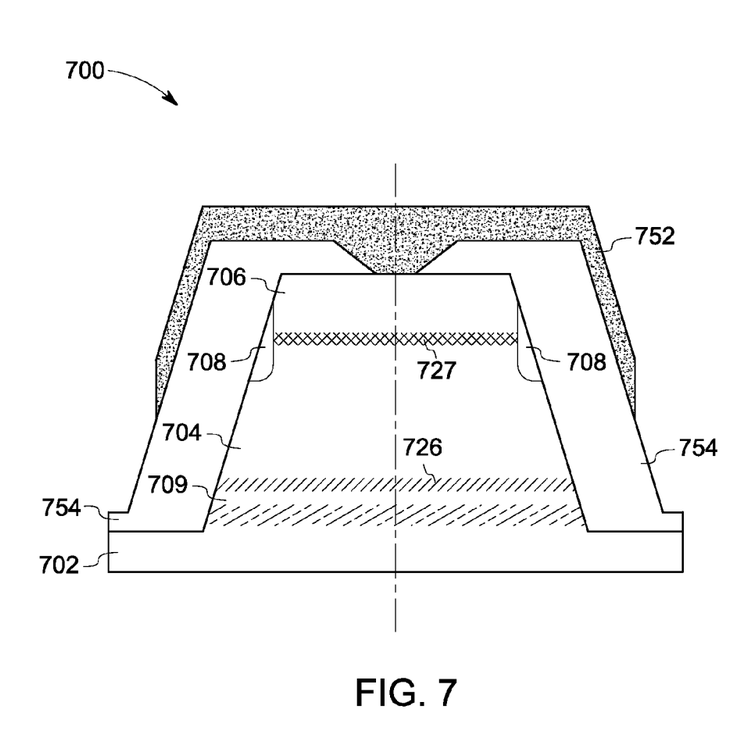
FIG. 7 is a cross-sectional view of a semiconductor device including a field plate and a passivation layer in accordance with an embodiment of the invention.

In one embodiment of the invention the first conductivity type is p-type and the second conductivity type is n-type. In one embodiment of the invention, the first conductivity type is n-type and the second conductivity type is p-type. In one embodiment of the invention, the first region 402 and the second region 404 are physically contiguous. In one embodiment of the invention, the field response modification region 408 further includes an implanted resistive region of type 708 (FIG. 7).

In one non-limiting simulated embodiment of the invention, the device 400 was simulated to have a varying dopant concentration profile in the vicinity of an interface 419 between the resistance modification region 406 and the field response modification region 408, and the field response modification region 408 and the second region 404, has a negative beveled profile. The resistance modification region 406 is about 0.1 micrometers thick and has a dopant concentration of about $2 \times 10^{19}/cm^3$, the field response modification region 408 is about 0.2 micrometers thick and has a dopant concentration of about $2 \times 10^{18}/cm^3$, and the second region 404 is about 2.7 micrometers thick and has a dopant concentration of about $1 \times 10^{16}/cm^3$. In one embodiment of the invention, a dopant concentration profile in the vicinity of an interface between the first region 402 and the second region 404 has a positive beveled profile. The first region 402 is about 2 micrometers thick and has a dopant concentration of about $3 \times 10^{18}/cm^3$ and the second region 404 is about 2.7 micrometers thick and has a dopant concentration of about $1 \times 10^{16}/cm^3$.

Figure 5:
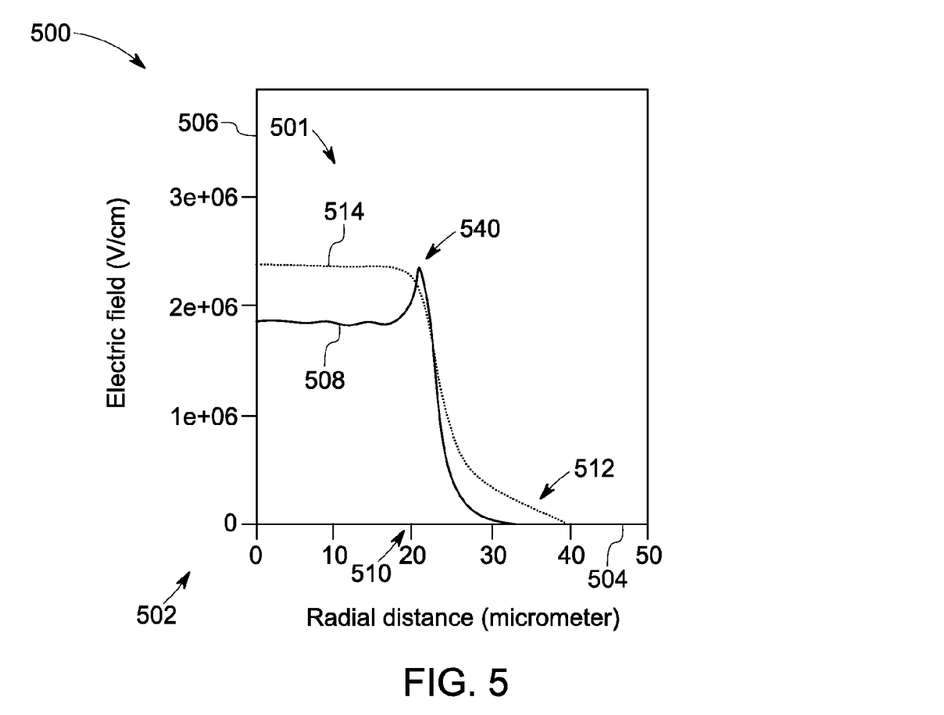
FIG. 5 is a simulated graphical representation of a variation of electric field as a function of radial distance within an embodiment of the semiconductor device of FIG. 4.

In FIG. 5 are presented the results of two such computations, wherein variation of electric field within the semiconductor device 400 was calculated along lines beginning at different locations on the axis 401 and extending outward in a given radial direction 424 till the edge 603. FIG. 5 is a graph 500 that shows two data sets 501, plotted together on a rectangular coordinate system 502 for comparison. The abscissa 504 of the rectangular coordinate system 502 represents a radial distance along a radial direction 524, while the corresponding value of electric field is plotted along the ordinate 506 of the rectangular coordinate system 502. A first length scale 411 analogous to the first length scale 111 (FIG. 1) is indicated as location 510 on the abscissa 504. Also, and similarly to the case of FIG. 1, a second length scale may be defined for the semiconductor device of FIG. 4. As was the case for the embodiment shown in FIG. 1, it may be clear that the value of the second length scale for the embodiment shown in FIG. 4 is also function of location along axis 401. For instance, in the presently illustrated embodiment 400, the value of the second length scale increases substantially linearly as one goes from the "top" edge 405 of the semiconductor device 400, towards the "bottom" 415 edge of the semiconductor device 400.

The data sets 501 plotted in FIG. 5 were computed for typical operating conditions near breakdown at 610 Volts, and as such the data sets 501 may be considered representative of the considerations involved in the discussions herein.

Plot 508 in FIG. 5 shows a variation of electric field as a function of distance along a radial line beginning from a point 428 (FIG. 4) on the axis 401 and extending outward in a radial direction, say 424, till a point 430 on the edge 403 of the semiconductor device 400. The point 428 is substantially in a vicinity of an interface region 409 between the second region 404 and the field response modification region 408. Similarly to the case of plot 508, plot 514 in FIG. 5 shows a computed variation of an electric field as a function of distance along a radial line beginning from a point 420 on the axis 401 and extending outward in a radial direction, say 424, till a point 425 on the edge 403 of the semiconductor device 400. The point 420 lies within an interface region 426 between the first region 402 and the second region 404 (FIG. 4). The radial distance 423 between the points 420 and 425 within the semiconductor device 400 corresponds to the second length scale for this case, and is indicated as the location 512 on the abscissa 504.

It may be evident from FIG. 5, that the radial distance dependence of the electric field for the two data sets 508 and 514 is substantially similar up to approximately the first length scale indicated as location 510. For radial distances beyond location 510 and up to approximately the location 512 corresponding to the second length scale, the radial distance dependence of the electric field for the two data sets 508 and 514 show different trends: for instance, data set 508 shows a distinct peak 540 in the vicinity of the first length scale. On the other hand, the data set 514, which shows only a gradual downward change of slope in the vicinity of the first length scale.

A comparison of data sets 501 and 301 from FIGS. 5 and 3 respectively reveals that the magnitude of the peak 540 is substantially depressed when compared against a magnitude of the peak 340. As per a discussion presented earlier, it is possible that this depression may result (discussed further below) in a frustum like embodiment to display V-I operational characteristics that are substantially similar to the V-I operational characteristics of an orthogonal embodiment.

Figure 6:
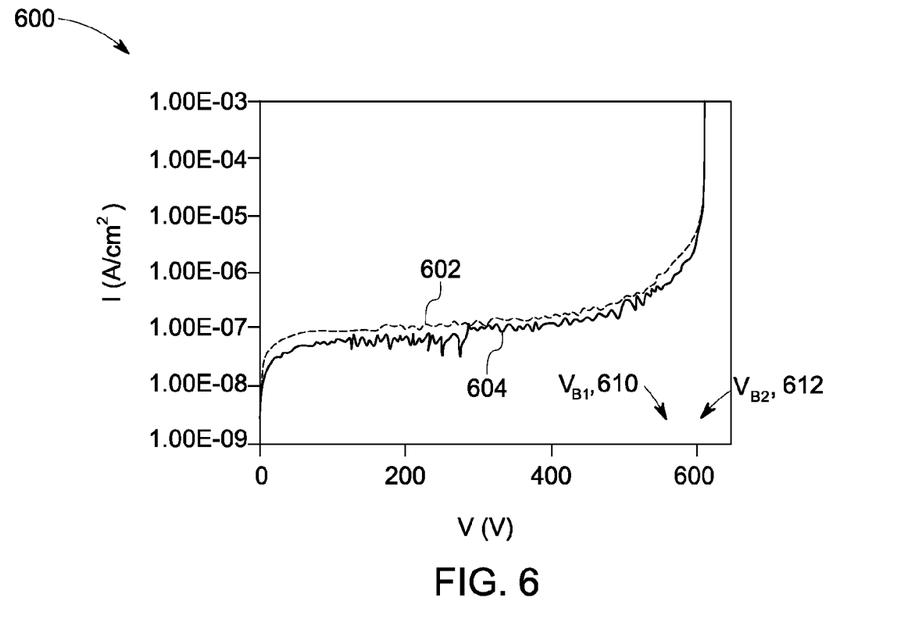
FIG. 6 is a simulated plot of a voltage versus current characteristics of embodiments of the semiconductor device of FIG. 4.

Information about an operational performance of the simulated semiconductor device 400 may be obtained from an analysis of voltage versus current (V-I) characteristics of the semiconductor device 400. The simulated voltage (V) was applied as a reverse bias between the at least one electrical contact pad 410 and the at least one second electrical contact pad 413. The simulated current (I) was measured across the same set of contact pads. In FIG. 6 are plotted computed V-I characteristics of two embodiments of the semiconductor device 400: computed V-I characteristic 602 belongs to an embodiment of the semiconductor device 400 in which the angle 416 is obtuse and approximately about 110 degrees; furthermore, computed V-I characteristic 604 belongs to an embodiment of the semiconductor device 400 in which the angle 416 is substantially orthogonal. From a perusal of V-I characteristic 602, it may be evident that the embodiment to which it corresponds displays breakdown mode operation above a voltage $V_{B1}$ of approximately 610 Volts. From a similar perusal of V-I characteristic 604, it may be evident that the embodiment to which it corresponds displays breakdown mode operation above a voltage $V_{B2}$ also of approximately 610 Volts. It is evident that $V_{B1}$ and $V_{B2}$ are nearly the same, i.e., a semiconductor device, containing a field response modification region 408 having a uniformly varying dopant concentration, and having an angle 416 that is obtuse displays a breakdown voltage almost the same as the breakdown voltage of a semiconductor device having an angle 416 that is substantially orthogonal, i.e., the presence of a field response modification region having a varying dopant concentration distribution along a thickness direction of the field response modification region results in a substantial matching of the V-I characteristics. In one embodiment of the invention, the value of the angle 416 is selected to be less than about 40 degrees. In one embodiment of the invention, the value of the angle 416 is selected to be less than about 45 degrees.

In one embodiment of the invention, a value of a breakdown electric field of the semiconductor device is in a range from about $1\times10^5$ Volts per centimeter (V/cm) to about $8\times10^6$ V/cm. In another embodiment of the invention, a value of a breakdown electric field of the semiconductor device is in a range from about $1\times10^5$ V/cm to about $6\times10^6$ V/cm.

The semiconductor device 400 can be fashioned out of any one or more suitable semiconducting and dopant materials. In one embodiment of the invention, the first region 402, the second region 404, the field response modification region 408, and the resistance modification region 406 independently at each occurrence include a material including silicon carbide, gallium nitride, gallium arsenide, silicon, indium phosphide, gallium phosphide, germanium, or combinations thereof. In one embodiment of the invention, the first region 402, the second region 404, the response modification region 408, and the resistance modification region 406 independently may include a dopant including aluminum, nitrogen, boron, phosphorus, gallium, oxygen, vanadium, titanium, germanium, silicon, carbon, magnesium, zinc, antimony, iron, or combinations thereof.

In one embodiment of the invention, a value of a concentration of the dopant within the first region 402 is selected to be in a range from about $10^{17}/cm^3$ to about $10^{21}/cm^3$. In one embodiment of the invention, a value of a concentration of the dopant within the second region is selected to be in a range from about $10^{17}/cm^3$ to about $10^{21}/cm^3$. In one embodiment of the invention, a value of a concentration of the dopant within the field response modification region 408 is selected to be in a range from about $10^{11}/cm^3$ to about $10^{21}/cm^3$. In one embodiment of the invention, a value of a concentration of the dopant within the resistance modification region 406 is selected to be in a range from about $10^{11}/cm^3$ to about $10^{17}/cm^3$.

In one embodiment of present invention, thickness of the field response modification region 408 is one of the factors controlling the ability of the semiconductor device 400 to mitigate its premature breakdown. In one embodiment of the invention, the response modification region 408 has a thickness in a range from about 100 nanometers (nm) to about 10000 nm.

In one embodiment of the invention, the varying dopant concentration distribution within the field response modification region 408 includes a substantially monotonically varying dopant concentration from a first concentration value to a second concentration value. In one non-limiting example of such an embodiment, the monotonically varying dopant concentration distribution includes a dopant concentration having a profile that is monotonically and substantially constantly varying between the first concentration value and the second concentration value. In one non-limiting example of such an embodiment, the first concentration value is about $1\times10^{19}/cm^3$ and the second concentration value is about $1\times10^{16}/cm^3$.

FIG. 7 shows an example of such a semiconductor device 700 that includes a first region 702 of a first conductivity type, a second region 704 of a second conductivity type disposed adjacent to the first region 702 to form a p-n junction structure, a resistance modification region 706 of the second conductivity type, and an implanted resistive region 708 disposed so as to be in contact with the resistance modification region 706 and the second region 704, wherein an electrical resistance of the implanted resistive region 708 is substantially greater than a resistance of the resistance modification region 706 as well as of the second region 704.

In one embodiment of the invention, a conductivity of the implanted resistive region 708 is of the second conductivity type. In one embodiment of the invention, a dopant concentration profile in a vicinity of an interface 727 between the resistance modification region 706 and second region 704 has a negative beveled profile, and wherein a dopant concentration profile in a vicinity of an interface 726 between the first region 702 and the second region 704 has a positive beveled profile.

Embodiments of the semiconductor devices 700 or 400 may further include a field plate. A non-limiting example of such a field plate 752 is shown in FIG. 7. In one embodiment, the field plate 752 is disposed so as to cover at least a portion the semiconductor device 700. Examples of materials suitable to comprise the field plate include, but are not limited to, silicon, indium phosphate, gallium phosphate, germanium, titanium, tungsten, molybdenum, nickel, gold, platinum, gallium phosphate, or combinations thereof. In one embodiment, the semiconductor device 700 or 400 further includes a passivation layer 754 disposed so as to cover at least a portion the semiconductor device 700. Non-limiting examples of materials from which the passivation layer may be composed include polyamides, oxides, or combinations thereof.

In one embodiment of the invention, the implanted resistive region 708 may be fabricated by an ion-implantation technique whereby ions are implanted within the semiconductor device 700, so that the implanted resistive region 708 is formed to be in contact with the second region 704 and the resistance modification region 706. Ion implantation techniques are known in the art and any such ion implantation technique that is suitable may be used for the fabrication of the implanted resistive region 708. The implanted resistive region 708 is fabricated so that its physical dimensions, and/or physical characteristics such as radiation defects, confer to it an electrical resistance that is in excess of an electrical resistance of the resistance modification region 706 as well as of the second region 704. Without being limited to any particular theory, it is possible that the radiation defects act as traps for charge carriers that constitute an electrical current during operation of the semiconductor device 700. Non-limiting examples of the ions include argon, carbon, boron, aluminum, nitrogen, or combinations thereof.

It is also envisaged to have embodiments of the invention that include a field response modification region of type 408 as well as an implanted resistive region of type 708. In such embodiments, the implanted resistive region of type 708 would be in contact with a resistance modification region of type 406, a second region of type 404, and a field response modification region of type 408. Those skilled in the art may also recognize that semiconductor devices 700 and 400 may also include an intrinsic "i" region. Thus, as further shown in FIG. 7, it is also envisaged to have embodiments of the invention that independently include an intrinsic "i" region 709 as shown between and in contact with the first region 702 and the second region 704.

In one embodiment of the invention, the semiconductor device 400 is a photodiode. In one embodiment of the invention, the photodiode is an avalanche photodiode.

Figure 8:
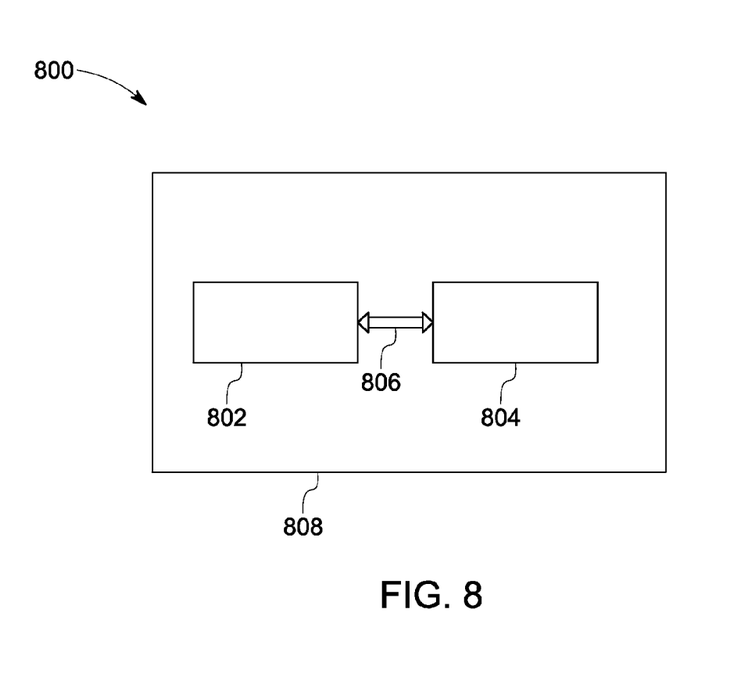
FIG. 8 is a schematic view of an electronic system in accordance with an embodiment of the invention.

In one embodiment of the invention, an electronic system 800 is disclosed. The electronic system includes, a semiconductor device 802, and an arrangement 804 for reverse biasing the semiconductor device 802 that is in communication 806 with the semiconductor device 802. Non-limiting examples of the semiconductor device 802 include, for example, a photodiode, an avalanche photodiode, a p-i-n diode, an impact ionization avalanche transit time (IMPATT) diode, or combinations thereof. The semiconductor device 802 can be a semiconductor device of type 400 or 700. In one embodiment, the semiconductor device 802 includes, a first region of a first conductivity type (not shown), a second region of a second conductivity type (not shown) disposed adjacent to the first region to form a p-n junction structure, a resistance modification region of the second conductivity type (not shown) disposed adjacent to the second region and on an opposite side of the first region, and a field response modification region (not shown) of the second conductivity type disposed between the resistance modification region and the second region. The field response modification region includes a varying dopant concentration distribution along a thickness direction of the field response modification region. In one embodiment of the invention, the electronic system 800 is housed inside a hermetic packaging 808. In one embodiment, the at least a portion 810 of the hermetic packaging 808 may be transparent to certain wavelengths of light. Non-limiting examples of areas of application of electronic system 800 include all areas where a photodiode can be used. In a non-limiting example, the electronic system 800 is a light detection and measurement system.

In one embodiment of the invention, the semiconductor device may be encapsulated in a hermetic packaging. The hermetic packaging serves to protect the semiconductor device from environments where the semiconductor device is likely to be used. Furthermore, in one embodiment of the invention, the semiconductor device is capable of operation within environments where a temperature is between a range from about minus 30° C. to about 300° C. Examples of such suitable hermetic packaging include, but are not limited to, silicon carbide, ceramic based epoxies such as those containing alumina, glass, quartz, silicon nitride, silicon dioxide, refractory metals such as molybdenum and tungsten, and any combinations thereof.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

The invention claimed is:

1. A semiconductor device comprising:
  a first region (402) of a first conductivity type;
  a second region (404) of a second conductivity type disposed adjacent to the first region to form a p-n junction structure;
  a resistance modification region (406) of the second conductivity type, wherein the resistance modification region comprises a varying dopant concentration distribution region along a thickness direction of the resistance modification region; and
  a field response modification region (408) of the second conductivity type having a thickness and disposed between and in contact with the resistance modification region (406) and the second region (402), wherein the field response modification region (408) comprises a varying dopant concentration distribution region along the thickness of the field response modification region (408).

2. The semiconductor device of claim 1, wherein the first conductivity type is p-type and the second conductivity type is n-type.

3. The semiconductor device of claim 1, wherein the field response modification region further comprises an implanted resistive region.

4. The semiconductor device of claim 1, wherein the varying dopant concentration distribution comprises a substantially monotonically varying dopant concentration from a first concentration value to a second concentration value.

5. The semiconductor device of claim 4, wherein a dopant concentration profile in a vicinity of an interface between the resistance modification region and the field response modification region, and the field response modification region and the second region, has a negative beveled profile.

6. The semiconductor device of claim 4, wherein a dopant concentration profile in a vicinity of an interface between the first region and the second region has a positive beveled profile.

7. The semiconductor device of claim 4, wherein the varying dopant concentration distribution comprises a substantially constantly varying dopant concentration.

8. The semiconductor device of claim 4, wherein the first concentration value is in a range from about $10^{17}/cm^3$ to about $10^{21}/cm^3$ and wherein the second concentration value is in a range from about $10^{11}/cm^3$ to about $10^{17}/cm^3$.

9. The semiconductor device of claim 1, wherein the first region, the second region, the field response modification region, and the resistance modification region independently at each comprise a material comprising silicon carbide, gallium nitride, gallium arsenide, silicon, indium phosphate, gallium phosphide, germanium, or combinations thereof.

10. The semiconductor device of claim 1, wherein the first region, the second region, the field response modification region, and the resistance modification region at each occurrence comprise a dopant comprising, aluminum, nitrogen, boron, phosphorus, gallium, oxygen, vanadium, titanium, germanium, silicon, carbon, magnesium, zinc, antimony, iron, or combinations thereof.

11. The semiconductor device of claim 1, wherein a value of a concentration of the dopant within the first region is selected to be in a range from about $10^{17}/cm^3$ to about $10^{21}/cm^3$.

12. The semiconductor device of claim 1, wherein a value of a concentration of the dopant within the second region is selected to be in a range from about $10^{11}/cm^3$ to about $10^{17}/cm^3$.

13. The semiconductor device of claim 1, wherein a value of a concentration of the dopant within the field response modification region is selected to be in a range from about $10^{11}/cm^3$ to about $10^{21}/cm^3$.

14. The semiconductor device of claim 1, wherein a value of a concentration of the dopant within the resistance modification region is selected to be in a range from about $10^{17}/cm^3$ to about $10^{21}/cm^3$.

15. The semiconductor device of claim 1, wherein the field response modification region has a thickness in a range from about 100 nm to about 10000 nm.

16. The semiconductor device of claim 1, further comprising a field plate disposed so as to cover at least a portion the semiconductor device.

17. The semiconductor device of claim 16, wherein the field plate comprises a material comprising, silicon, indium phosphate, gallium phosphate, germanium, titanium, tungsten, molybdenum, nickel, gold, platinum, and gallium phosphate.

18. The semiconductor device of claim 1, wherein a value of a breakdown electric field of the semiconductor device is in a range from about $1 \times 10^5$ V/cm to about $8 \times 10^6$ V/cm.

19. The semiconductor device of claim 1, wherein the outer edges slope at an angle that is obtuse with a horizontal.

20. The semiconductor device of claim 1, wherein an angle of the outer edges to the thickness direction is selected to be less than about 45 degrees.

21. The semiconductor device of claim 1, wherein the semiconductor device comprises a photodiode.

22. The semiconductor device of claim 21, wherein the photodiode comprises an avalanche photodiode.

23. An electronic system comprising:
a semiconductor device; and
an arrangement for reverse biasing the semiconductor device;
wherein, the semiconductor device comprises:
  a first region of a first conductivity type;
  a second region of a second conductivity type disposed adjacent to the first region to form a p-n junction structure;
a resistance modification region of the second conductivity type, wherein the resistance modification region comprises a varying dopant concentration distribution region along a thickness direction of the resistance modification region; and
a field response modification region of the second conductivity type having a thickness disposed between the resistance modification region and the second region, wherein the field response modification region comprises a varying dopant concentration distribution along the thickness direction of the field response modification region.

24. The electronic system of claim 23, wherein the semiconductor device is selected from the list consisting of a photodiode, an avalanche photodiode, a p-i-n diode, an IMPATT diode, or combinations thereof.

25. The electronic system of claim 23, wherein the electronic system is encapsulated within a hermetic packaging.

* * * * *